United States Patent
Bouleau et al.

(10) Patent No.: US 10,310,032 B2
(45) Date of Patent: Jun. 4, 2019

(54) FLUID CHANNELLING SYSTEM OF AN NMR SYSTEM AND METHOD OF OPERATING A SYSTEM OF THIS KIND

(71) Applicant: COMMISSARIAT A L'ENERGIE ATOMIQUE ET AUX ENERGIES ALTERNATIVES, Paris (FR)

(72) Inventors: Eric Bouleau, Sassenage (FR); Daniel Lee, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 15/403,703

(22) Filed: Jan. 11, 2017

(65) Prior Publication Data
US 2017/0199255 A1 Jul. 13, 2017

(30) Foreign Application Priority Data

Jan. 12, 2016 (FR) ..................... 16 50224

(51) Int. Cl.
*G01R 33/30* (2006.01)
*G01R 33/31* (2006.01)
*F25B 9/00* (2006.01)
*F25B 9/10* (2006.01)

(52) U.S. Cl.
CPC ............... *G01R 33/31* (2013.01); *F25B 9/00* (2013.01); *F25B 9/10* (2013.01); *G01R 33/307* (2013.01)

(58) Field of Classification Search
None
See application file for complete search history.

(56) References Cited

U.S. PATENT DOCUMENTS

| 4,511,841 A * | 4/1985 | Bartuska ............... G01R 33/307 324/318 |
| 5,508,613 A * | 4/1996 | Kotsubo ............... F25D 19/006 324/315 |
| 2006/0022779 A1* | 2/2006 | Jiang ..................... F25D 19/006 335/216 |
| 2007/0257676 A1* | 11/2007 | Sacher ............. G01R 33/34015 324/318 |
| 2007/0261416 A1 | 11/2007 | Harvey et al. |
| 2011/0000228 A1 | 1/2011 | Harvey et al. |
| 2011/0284192 A1* | 11/2011 | Grossniklaus ......... G01R 33/31 165/135 |

(Continued)

FOREIGN PATENT DOCUMENTS

WO 2014/102349 A2 7/2014

OTHER PUBLICATIONS

European Search Report and Written Opinion dated Jun. 12, 2017 in corresponding European application No. 17151070; with English partial translation and partial machine translation (28 pages).

(Continued)

*Primary Examiner* — Patrick Assouad
*Assistant Examiner* — Demetrius R Pretlow
(74) *Attorney, Agent, or Firm* — Westerman, Hattori, Daniels & Adrian, LLP

(57) ABSTRACT

Fluid channeling system (150) for NMR system (100), characterized in that the channeling system (150) includes an exhaust circuit (160) of the NMR system (100) comprising a first fluid circulation branch (161) and a second fluid circulation branch (162).

22 Claims, 2 Drawing Sheets

(56) References Cited

U.S. PATENT DOCUMENTS

Figure 1:
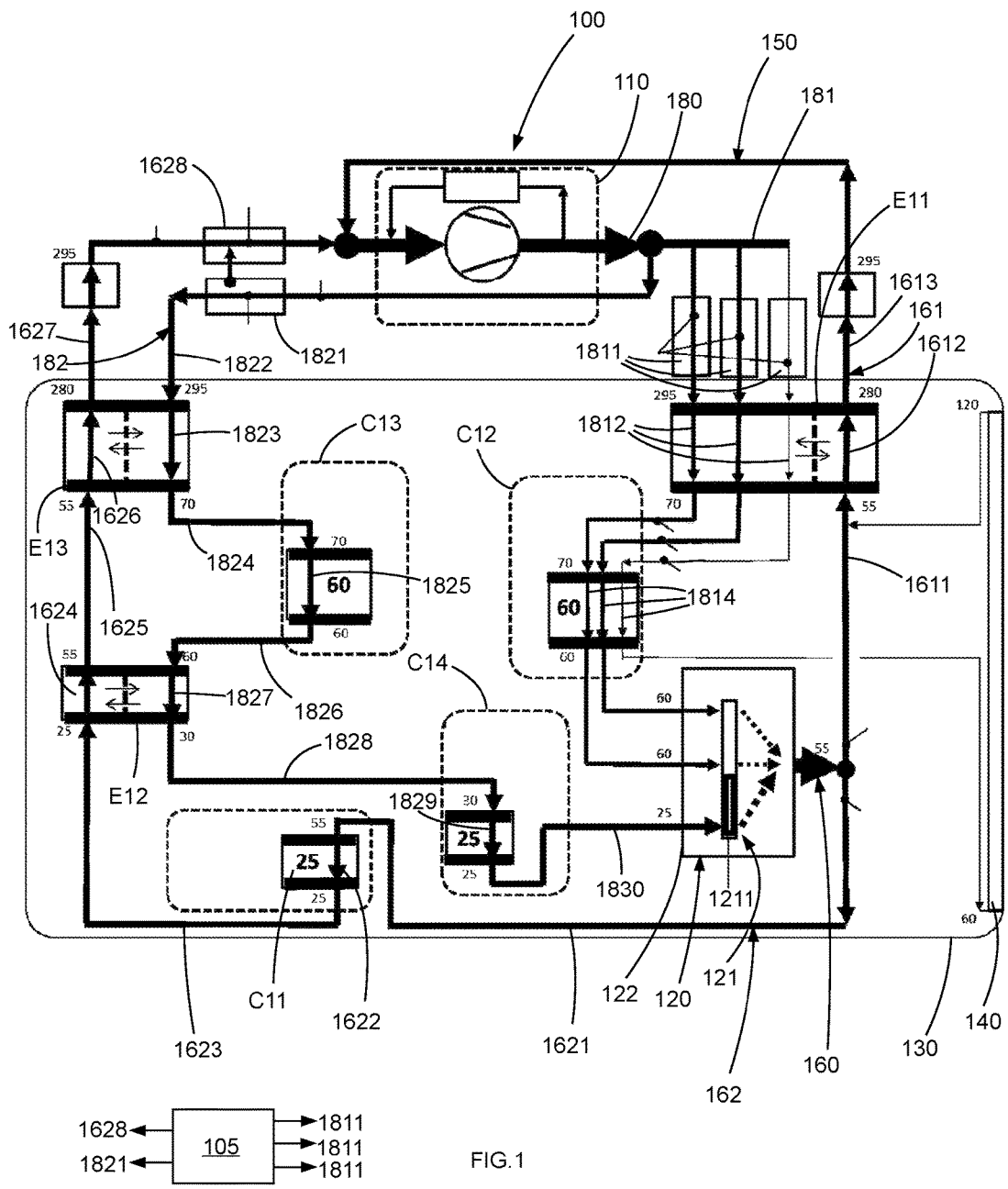

| | | | | |
|---|---|---|---|---|
| 2013/0091870 A1* | 4/2013 | Krencker | ............. | F17C 9/02 |
| | | | | 62/48.1 |
| 2013/0147485 A1* | 6/2013 | Yokoi | ............. | G01R 33/385 |
| | | | | 324/318 |
| 2013/0184158 A1* | 7/2013 | Wang | ............. | G01R 33/3815 |
| | | | | 505/162 |
| 2014/0203809 A1* | 7/2014 | Tanaka | ............. | G01R 33/3804 |
| | | | | 324/318 |
| 2015/0323619 A1* | 11/2015 | Bouleau | ............. | G01R 33/31 |
| | | | | 324/309 |
| 2016/0223628 A1* | 8/2016 | Fujiwara | ............. | G01R 33/282 |

OTHER PUBLICATIONS

Potter, "Apparatus to Rotate Samples Rapidly at Temperatures Less than 2 K in High Transverse Magnetic Fields", Review of Scientific Instruments, vol. 42, No. 5, May 31, 1971, pp. 618-625.

Matsuki et al., "Closed-cycle cold helium magic-angle spinning for sensitivity-enhanced multi-dimensional solid-state NMR", Journal of Magnetic Resonance, vol. 259, Aug. 12, 2015, pp. 76-81.

Concistre et al., "Magic-Angle Spinning NMR of Cold Samples", Accounts of Chemical Research, vol. 46, No. 9, Sep. 17, 2013, pp. 1914-1955.

French Search Report and Written Opinion dated Aug. 31, 2016 issued in counterpart application No. FR1650224; w/ English partial translation and partial machine translation (32 pages).

\* cited by examiner

FLUID CHANNELLING SYSTEM OF AN NMR SYSTEM AND METHOD OF OPERATING A SYSTEM OF THIS KIND

This application claims priority of French application No. 1650224 filed Jan. 12, 2016, which is hereby incorporated by reference herein in its entirety.

The invention concerns a fluid channeling system of an NMR system. The invention also concerns an NMR system including a channeling system of this kind. The invention further concerns a method of operating systems of this kind.

An NMR device (or Nuclear Magnetic Resonance detection or analysis device) includes a sample-holder rotated in a static magnetic field and exposed to a second magnetic field perpendicular to the first and created by a radio-frequency coil that receives in return a signal that is analyzed to deduce from it information on a solid sample disposed in the sample-holder. According to one prior art embodiment, a plurality of gas flows coming from the same source, a standard container such as a pressurized helium cylinder, are directed toward the probe of the device that includes the sample-holder. A first flow has the function of rotating the sample-holder by acting on the blades or fins of a drive turbine of a rotor that includes the sample-holder. A second flow has the function of bringing the sample to a certain temperature. A third flow creates an aerostatic bearing supporting the rotor in the stator. A possible fourth flow makes it possible to cool a heat shield protecting the device from thermal radiation.

The flows are provided and channeled by a channeling system. The channeling system and the NMR device form an NMR system.

The search for the best performance in analysis of a sample in the solid state by NMR utilizes rotation of the sample about a particular axis termed the "magic angle". It is important to reach a high rotation speed. Also, the increasing intensity of the magnetic fields, which at present reaches approximately 20 Tesla, has improved the sensitivity of NMR detection. It is nevertheless very difficult at the present time to increase this intensity.

Existing solutions remain imperfect and inadequate and there is therefore a general requirement to improve NMR detection and analysis of a solid sample.

For a few years research laboratories and industry have been working on developing prototypes in order to achieve a sample rotation frequency of several tens of kilohertz within the temperature range 10K-100K.

To be more precise, the sample to be studied or qualified by this technique is placed in a tube that has the rotor function. This tube, which is equipped either with a plug at one end if the other is blind or with two plugs, forms the sample-holder or rotor and is installed in a stator. The plugs are machined so that they form turbines (therefore one or two turbines per rotor). The turbines are fed with the gas flows distributed by the stator. The rotor is therefore rotated. The rotor-stator assembly constituting a rotary machine includes gas bearings the configuration of which may be of the aerodynamic, aerostatic or hybrid type. The bearings are also fed by the gas flows via the stator. Another gas flow makes it possible to bring the sample to the temperature required for the study. A system of this kind is of small size since the diameter of the sample-holder rotor can be between 0.7 mm and 7 mm inclusive. This implies that the stator-rotor assembly is very compact.

The various gas flows can be distributed radially or tangentially onto the rotor. They can be evacuated axially, from the centre toward the exterior of the stator. The gas flows feeding the turbine or turbines are evacuated the most easily because the turbine or turbines is or are situated at the ends of the rotor. The gas flows feeding the bearings reach the rotor in the vicinity of the turbines. The gas flow cooling the sample reaches the rotor in its central region.

This fluidic arrangement is such that the flow cooling the sample, when it is evacuated axially, sweeps the regions of the bearings and then the regions of the turbines. For their part, the flows feeding the bearings, when they are evacuated axially, sweep the regions of the turbines. The flows feeding the bearings create cold corners in the regions of the bearings. There follows from this a relative sealing such that the flows feeding the turbines situated at the ends of the rotor cannot be evacuated toward the central region of the rotor. The flows feeding the turbines are therefore not able to influence the temperature of the central region of the rotor where the sample is located. The flows feeding the bearings are directed and evacuated on the axis of the rotor, toward its ends and pushed by the flow cooling the central region of the rotor and the sample.

The materials used to fabricate the tube and the turbines (ceramics and plastics) are poor thermal conductors. It follows from this that the heat flow (by conduction in a solid) from the ends of the rotor to the central region of the rotor is negligible. A region of contact at the interfaces of the tube and the turbines moreover creates a contact thermal resistance that commensurately further limits the thermal flow.

Consequently, the temperatures of the flows feeding the bearings and the turbines may be higher than that of the flow cooling the sample.

To operate at very low temperature it is necessary to feed cold gases.

In the temperature range from 90K to 300K nitrogen is obviously the fluid of choice in that it is safe, of relatively low cost and simple to use.

At lower temperature and down to approximately 10K, helium is the obligatory element to be used because of its thermal and physical characteristics. This is also the case above 90K because, apart from the thermal aspects, helium makes it possible to obtain rotation frequencies twice those generated with nitrogen. However, although indispensible for NMR at between 10K and 90K, helium generates operating costs that quickly become prohibitive. Accordingly, very few laboratories worldwide are able to carry out NMR analyses, even experimentally, below 100K.

Two solutions are applied at present to alleviate this difficulty.

As it is theoretically necessary to cool only the sample, neglecting thermal losses, only the flow for cooling the sample requires refrigerated fluid. A prototype developed several years ago therefore uses nitrogen as the fluid for feeding the bearings and the turbines and helium as the fluid for cooling the sample. This technique necessitates a rotor of greater length to reduce the thermal influence on the central region of the nitrogen at 90K used at the ends of the rotor (in the regions of the bearings and the turbines). This central region is fed with a flow of helium at between 10K and 90K. Although astute, this solution is technically complex to implement and is not durable for producing NMR spectra of long duration.

Another solution consists in recovering the exhaust gas from the stator and recirculating it in the device via a pressurized closed loop. In this loop, the gas is cooled to the required operating temperature by a cryogenic source via one or more heat exchangers. The system operates according to a Brayton cycle. Given the highly compact nature of this miniature pneumatic system, and above all its closed loop operation, the only solution seems to lie in the use of flows that are all at the same temperature. The gas recovered at the exhaust of the stator common to the various flows is injected into a contraflow heat exchanger in order to exchange heat with the various flows feeding the stator-rotor assembly to pre-cool those flows. If the temperatures of the flows feeding the bearings and/or the turbines were higher than the temperature of the flow cooling the sample, the temperature of the exhaust gas would be too high and would unbalance the thermal cycle, which would no longer be viable.

Operation with identical flow temperatures is not particularly problematical down to approximately 50K. Below 50K, operation becomes more complex for various reasons.

Below 30K, the thermal and physical characteristics of helium vary very considerably and in a non-linear manner and controlling rotation becomes difficult and sensitive if a constant rotation frequency is to be achieved.

At the level of the bearings, the high variation of the density of the helium leads to high contraction of the gas volume of the bearing. The flow rate must therefore be adjusted accordingly and rapidly to produce an appropriate and constant stiffness of the bearing in order to maintain rotation with no disturbing eccentricity of the frequency or even destruction of the rotor.

At the level of the turbines, the mechanical power impinging on the blades is a function of the ratio of the value of the mass flow rate cubed to the value of the gas density squared. The gas used to go from rotation at room temperature, that is to say at 300K, to rotation at 10K is necessarily helium. Now, the density of helium is substantially multiplied by 30 between 300K and 10K. The mass flow rate must therefore be multiplied by 10 over the same range of temperatures to obtain a constant power.

Accordingly, the flow rate to be applied to drive the rotation at a temperature T between 300K and 8K inclusive relative to the initial flow rate established at room temperature is quasi-exponential and depends on the following law:

$$m° = 50.5 \times T^{-0.68}$$

where m° is the mass flow rate and T is the temperature of the flow.

Between 300K and 50K the flow rate is increased by a factor of 3 to maintain a constant rotation frequency whereas from 50K to 25K this factor is virtually 2. Overall, for constant operation at 30 kHz down to 10K the mass flow rate must in theory be multiplied by 10. For example, a 2 mm diameter NMR probe rotor will necessitate a flow rate between 0.1 and 0.2 $g \cdot s^{-1}$ to rotate at 30 kHz at room temperature. This flow rate will have to be from 1 to 2 $g \cdot s^{-1}$ to function at 10K.

Consequently, the recirculation device and the cryogenic source (consisting of an exchanger and a cryorefrigerator) must be very adaptable but above all rated rather higher than would otherwise be required at high temperatures to handle these very high flow rate variations and to ensure correct operation at very low temperatures.

A final problem is caused by the coupling between the tube and the turbines. For reasons of mechanical reliability but also for economic reasons, the tube and the turbines are fabricated in different materials. The tube, which must offer the lowest possible magnetic susceptibility, is made of zirconia (zirconium dioxide), for example, a sintered material that is sensitive to impact, for which reason the turbines in which the fins are produced are made for example from a polymer based on polyimide such as Vespel® (registered trade mark of DuPont). These two materials offer good characteristics for working in the cryogenic domain but have differential contractions that are increasingly far apart as the temperature decreases. The turbine that is a snug fit in the tube at room temperature is less and less so as the temperature decreases. The loss of a turbine can then occur at random as a function of sudden changes in the flow rate regimes, as explained above.

It is therefore apparent that, for dynamic and mechanical reasons, it is desirable to employ flows feeding the bearings and the turbines at lower temperatures than the flow cooling the sample. However, in adopting this solution, the known prior art devices are not able to function correctly.

The object of the invention is to remedy the aforementioned drawbacks and to improve the known prior art NMR systems. In particular, the invention proposes a simple channeling system that makes it possible to manage the coolant fluid efficiently.

According to the invention, the channeling system for an NMR system includes an exhaust circuit of the NMR system comprising a first fluid circulation branch and a second fluid circulation branch.

Preferably, in this exhaust circuit, the first and second branches conduct simultaneously the coolant fluid from the NMR device to the compressor. Thus, a non-zero flow of the coolant fluid circulates simultaneously in the first and second branches when the NMR device operates.

The configuration of the exhaust circuit comprising those first and second branches participates to the implementation of a simple channeling system improving the efficiency of the management of the coolant fluid in this system by contributing to implement a flow that has the function to cool a sample of the NMR device to an appropriate temperature, this flow being separated from others flows preforming different others functions in this channeling system to higher temperatures as notably feeding bearings and turbines of the NMR device. Such a configuration offers thus a high level of flexibility in the operation of the NMR system.

The first branch may include no cryorefrigerator pipe and/or the second branch may include a pipe of a first cryorefrigerator.

The first branch may include a pipe of a first exchanger and/or the second branch may include a pipe of a second exchanger and a pipe of a third exchanger.

The system may include a feed circuit of the NMR system including a third fluid circulation branch and a fourth fluid circulation branch.

The third fluid circulation branch may include a plurality of sub-branches, notably a first sub-branch for circulation of a first flow the function of which is to rotate a sample-holder by acting on blades or fins of a drive turbine of a rotor of the NMR device, the rotor including the sample-holder, and/or a second sub-branch for circulation of a third flow the function of which is to create a bearing supporting the rotor in a stator of the NMR device and/or a third sub-branch for circulation of a fourth flow the function of which is to cool a heat shield protecting the NMR device from thermal radiation.

The third branch may include at least one pipe of a second cryorefrigerator and/or the fourth branch may include a pipe of a third cryorefrigerator and a pipe of a fourth cryorefrigerator.

The second cryorefrigerator and the third cryorefrigerator may be the same cryorefrigerator, notably the same stage of a cryorefrigerator.

The first cryorefrigerator and the fourth cryorefrigerator may be the same cryorefrigerator, notably the same stage of a cryorefrigerator.

The system may include a single cryorefrigerator, notably a cryorefrigerator including a first stage and a second stage. In other words, this single cryorefrigerator of the NMR system comprises two stages each fulfilling the functions of two cryorefrigerators such as those of the first cryorefrigerator and the fourth cryorefrigerators, and the second cryorefrigerator and the third cryorefrigerators.

The third branch may include at least one pipe of the first exchanger and/or the fourth branch may include a pipe of the third exchanger and a pipe of the second exchanger.

The second branch may include a flow rate regulator.

The third branch may include at least one flow rate regulator and/or the fourth branch may include a flow rate regulator.

An NMR system according to the invention includes a channeling system as defined above and an NMR device, notably an NMR analysis device.

According to a first aspect, a method of operating a system as defined above, is characterized in that the first and second branches conduct simultaneously the coolant fluid, notably between a NMR device of the NMR system and a compressor of the NMR system.

Preferably, the flow rates are regulated so that the fluid flow rates in the first and third branches are equal or substantially equal and/or in that the fluid flow rates are regulated so that the flow rates in the second and fourth branches are equal or substantially equal.

According to a second aspect, a method of operating a system as defined above is characterized in that the flow rates are regulated so that the fluid flow rates in the first and third branches are equal or substantially equal and/or in that the fluid flow rates are regulated so that the flow rates in the second and fourth branches are equal or substantially equal.

The objects, features and advantages of the present invention are explained in detail in the following description with reference to the appended drawings of two particular non-limiting embodiments. The appended drawings comprise:

FIG. 1, which represents diagrammatically a first embodiment of an NMR system according to the invention.

Figure 2:
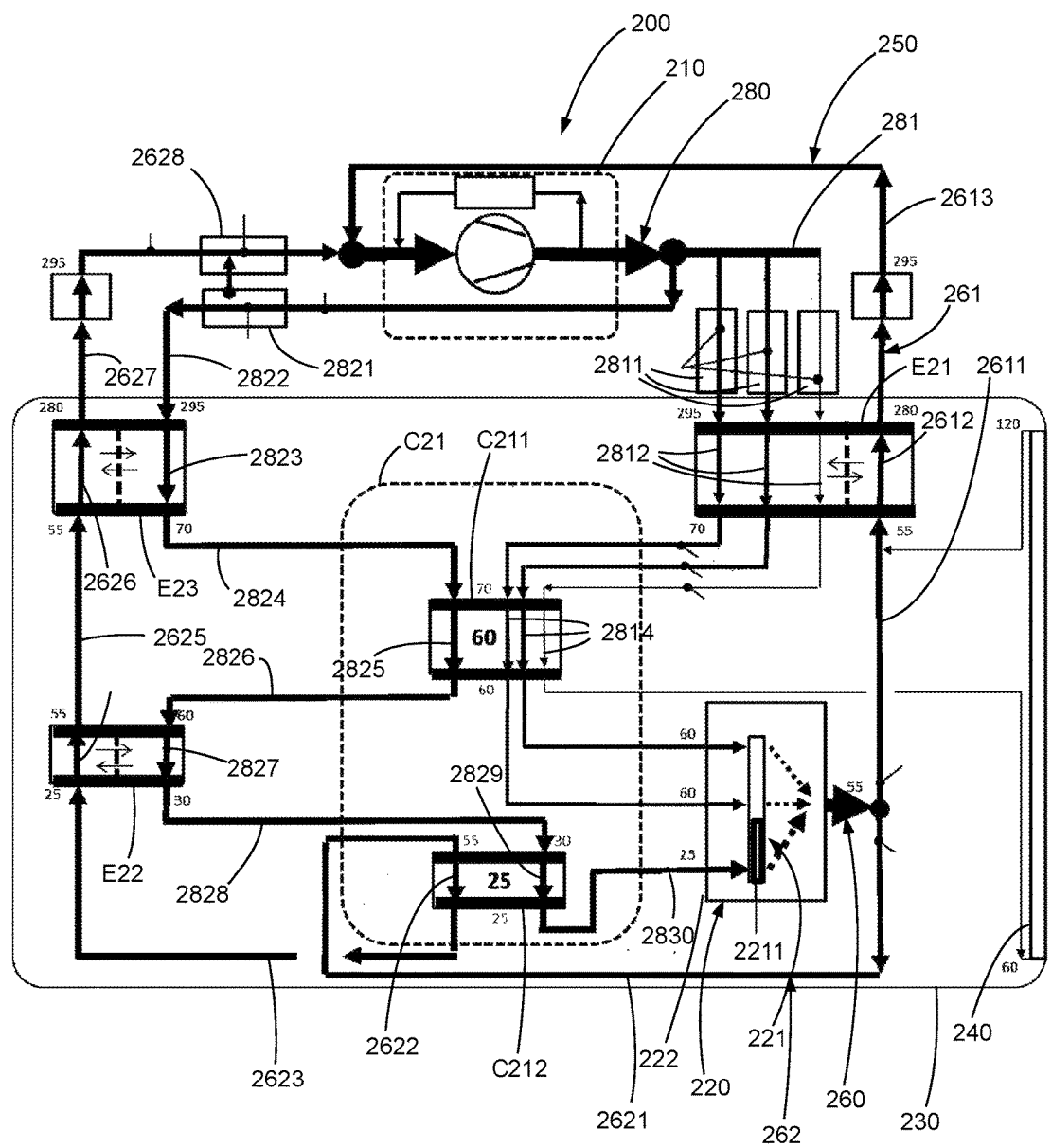
Figure 2:
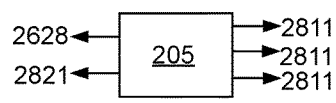

FIG. 2, which represents diagrammatically a second embodiment of an NMR system according to the invention.

A first embodiment of an NMR system 100 according to the invention is described hereinafter with reference to FIG. 1.

The NMR system 100 includes a compressor 110, an NMR device 120, a thermally insulated enclosure 130 and a first embodiment of a channeling system 150. The NMR device 100 comprises a rotor or a sample holder 121 including a turbine 1211. The NMR device 100 is arranged, in particular the rotor is guided, so that the sample can be rotated along a particular axis termed the "magic angle".

The thermally insulated enclosure 130 preferably includes a heat shield 140. The enclosure preferably encloses the NMR device 120 and part of the channeling system 150.

The channeling system 150 includes an exhaust circuit 160 for conveying a coolant fluid from the NMR device 120 to the compressor 110 and a feed circuit 180 for conveying the coolant fluid from the compressor 110 to the NMR device 120.

The exhaust circuit 160 includes a first exhaust branch 161 and a second exhaust branch 162. The exhaust circuit 160 is preferably divided into the first and second exhaust branches 161, 162 just after the NMR device 120. The two exhaust branches 161, 162 preferably join just before the compressor 110. The first and second branches 161, 162 are therefore preferably parallel branches.

The first exhaust branch 161 includes a pipe 1612 of a first exchanger E11. The first exhaust branch 161 obviously also includes pipes 1611 and 1613 complementing the pipe 1612 so as to guide some of the coolant fluid exhausted from the NMR device 120 to the compressor 110. A first part of the coolant fluid exhausted from the NMR device 120 therefore returns to the compressor 110 via the first exchanger E11.

The second exhaust branch 162 includes a pipe 1622 of a first cryorefrigerator C11, a pipe 1624 of a second exchanger E12 and a pipe 1626 of a third exchanger E13. The second exhaust branch 162 obviously also includes pipes 1621, 1623, 1625, 1627 complementing the pipes 1622, 1624, 1626 so as to guide some of the coolant fluid exhausted from the NMR device 120 to the compressor 110. A second portion of the coolant fluid exhausted from the NMR device 120 therefore returns to the compressor 110 via the first cryorefrigerator C11, the second exchanger E12 and the third exchanger E13. It advantageously passes through those elements in the above order.

In this configuration, the first and second exhaust branches 161, 162 conduct simultaneously the coolant fluid from the NMR device 120 to the compressor 110. In fact, preferably, those first and second branches 161, 162 connect a fluid outlet of the NMR device 120 to a fluid inlet of the compressor 110 in being devoid of at least one element of redirection and/or authorisation/prohibition of the passage of the coolant fluid, as a valve, comprised in at least one of the pipes 1611 to 1613 and 1621 to 1626 of those branches 161, 162. It will be noted that a flow rate regulator 1628 described below does not constitute an element of redirection and/or authorisation/prohibition of the passage of the coolant fluid.

The feed circuit includes a third feed branch 181 and a fourth feed branch 182. The feed circuit is preferably divided into the third and fourth feed branches 181, 182 just after the compressor 110. The two feed branches 181, 182 preferably remain separate as far as the NMR device 120. The third and fourth branches 181, 182 are therefore preferably parallel branches.

The third feed branch 181 include one or more pipes 1812 in the first exchanger E11 and one or more pipes 1814 in a second cryorefrigerator C12. The third feed branch 181 obviously also includes pipes complementing the pipes 1812 and 1814 so as to guide some of the coolant fluid from the compressor 110 to the NMR device 120. A first portion of the coolant fluid therefore flows from the compressor 110 to the NMR device 120 via the first exchanger E11 and the second cryorefrigerator C12. The fluid preferably passes through the various elements in the above order.

The fourth feed branch 182 includes a pipe 1823 of the third exchanger E13, a pipe 1825 of a third cryorefrigerator C13, a pipe 1827 of the second exchanger E12 and a pipe 1829 of a fourth cryorefrigerator C14. The fourth feed branch 182 obviously also includes pipes 1822, 1824, 1826, 1828 and 1830 complementing the pipes 1823, 1825, 1827 and 1829 so as to guide some of the coolant fluid from the compressor 110 to the NMR device 120. A second portion of the coolant fluid therefore flows from the compressor 110 to the NMR device 120 via the third exchanger E13, the third cryorefrigerator C13, the second exchanger E12 and the fourth cryorefrigerator C14. The fluid preferably passes through the various elements in the above order.

The first fluid portion flowing in the feed circuit consists of:

a first flow that has the function of rotating the sample-holder 121 by acting on blades or fins of the turbine 1211 driving the rotor of the NMR device 120, the rotor including the sample-holder 121;

a third flow that creates an aerostatic bearing supporting the rotor in a stator 122 of the NMR device 120; and, where applicable, a fourth flow for cooling the heat shield 140 protecting the NMR device 120 from thermal radiation.

The third circulation branch 181 therefore comprises three sub-branches:

a first sub-branch for circulation of the first flow the function of which is to rotate the sample-holder 121 by acting on the blades or the fins of a drive turbine of the rotor of the NMR device 120, the rotor including the sample-holder 121;

a second sub-branch for circulation of the third flow the function of which is to create a bearing supporting the rotor in a stator 122 of the NMR device 120;

a third sub-branch for circulation of the fourth flow the function of which is to cool a heat shield 140 protecting the NMR device 120 from thermal radiation.

The first exchanger E11 and the second cryorefrigerator C12 therefore have at the level of the third branch 181 as many pipes as sub-branches.

The second fluid portion flowing in the feed circuit consists of a second flow that has the function of bringing the sample to an appropriate temperature. Thus, the fourth branch 182 which conducts the second fluid portion also conducts the single flow of this second fluid portion whose sole function is to bring the sample to this appropriate temperature.

The second branch 162 includes a flow rate regulator 1628.

The third branch 181 includes three flow rate regulators 1811 for adjusting and/or regulating the flow rates in the three sub-branches.

The fourth branch 182 includes a flow rate regulator 1821.

These regulators 1628, 1811, 1821 are preferably of the flowmeter-regulator type, i.e. they also make it possible to measure the flow rates.

The channeling system 150 also includes a control module 105 like a microcontroller for receiving flow rate information and calculating in consequence thereof command instructions that are transmitted to the regulators 1628, 1811, 1821. Those instructions determine configurations of the various regulators 1628, 1811, 1821.

A second embodiment of an NMR system 200 according to the invention is described hereinafter with reference to FIG. 2.

The NMR 200 system includes a compressor 210, an NMR device 220, a thermally insulated enclosure 230 and a first embodiment of a channeling system 250. The NMR device 200 comprises a rotor or a sample holder 221 including a turbine 2211. The NMR device 200 is arranged, in particular the rotor is guided, so that the sample can be rotated along a particular axis termed the "magic angle".

The thermally insulated enclosure 230 preferably includes a heat shield 240. The enclosure 230 preferably encloses the NMR device 220 and part of the channeling system 250.

The channeling system 250 includes an exhaust circuit 260 for conveying a coolant fluid from the NMR device 220 to the compressor 210 and a feed circuit 280 for conveying the coolant fluid from the compressor 210 to the NMR device 220.

The exhaust circuit 260 comprises a first exhaust branch 261 and a second exhaust branch 262. The exhaust circuit 260 is preferably divided into the first and second exhaust branches 261, 262 just after the NMR device 220. The two exhaust branches 261, 262 preferably join just before the compressor 210. The first and second branches 261, 262 are therefore preferably parallel branches.

The first exhaust branch 261 includes a pipe 2612 of a first exchanger E21. The first exhaust branch 261 obviously also includes pipes 2611 and 1613 complementing the pipe 1612 so as to guide some of the coolant fluid exhausted from the NMR device 220 to the compressor 210. A first part of the coolant fluid exhausted from the NMR device 220 therefore returns to the compressor 210 via the first exchanger E21.

The second exhaust branch 262 includes a pipe 2622 of a stage C212 of a cryorefrigerator C21, a pipe 2624 of a second exchanger E22 and a pipe 2626 of a third exchanger E23. It will be noted, that this stage C212 of the cryorefrigerator C21 can be also identified as the first or fourth cryorefrigerator thereafter by analogy with the first and fourth cryorefrigerators C11, C14 of the channeling system 150 of the first embodiment of the NMR system 100. Indeed, this stage C212 has substantially the same characteristics and performs notably functions similar to those of these cryorefrigerators C11, C14. The second exhaust branch 262 obviously also includes pipes 2621, 2623, 2625, 2627 complementing the pipes 2622, 2624, 2626 so as to guide some of the coolant fluid exhausted from the NMR device 220 to the compressor 210. A second portion of the coolant fluid exhausted from the NMR device 220 thereof returns to the compressor 210 via the stage C212 of the cryorefrigerator C21, the second exchanger E22 and the third exchanger E23. It advantageously passes through these elements in the above order.

In this configuration, the first and second exhaust branches 261, 262 conduct simultaneously the coolant fluid from the NMR device 220 to the compressor 210. In fact, preferably, those first and second branches 261, 262 connect a fluid outlet of the NMR device 220 to a fluid inlet of the compressor 210 in being devoid of at least one element of redirection and/or authorisation/prohibition of the passage of the coolant fluid, as a valve, comprised in at least one of the pipes 2611 to 2613 and 2621 to 2626 of those branches 261, 262. It will be noted that a flow rate regulator 2628 described below does not constitute an element of redirection and/or authorisation/prohibition of the passage of the coolant fluid.

The feed circuit includes a third feed branch 281 and a fourth feed branch 282. The feed circuit is preferably divided into the third and fourth feed branches just after the compressor 210. The two feed branches 281, 282 preferably remain separate as far as the NMR device 220. The third and fourth branches 281, 282 are therefore preferably parallel branches.

The third feed branch 281 includes one or more pipes 2812 in the first exchanger E21 and one or more pipes 1814 in a stage C211 of the cryorefrigerator C21. It will be noted, that this stage C211 of the cryorefrigerator C21 can be also identified as the second or third cryorefrigerator thereafter by analogy with the second and third cryorefrigerators C12, C13 of the channeling system 150 of the first embodiment of the NMR system 100. Indeed, this stage C211 has substantially the same characteristics and performs notably functions similar to those of these cryorefrigerators C12, C13. The third feed branch 281 obviously also includes pipes complementing the pipes 2812 and 2814 so as to guide some of the coolant fluid from the compressor 210 to the NMR device 220. A first portion of the coolant fluid therefore circulates from the compressor 210 to the NMR device 220 via the first exchanger E21 and the stage C211 of the cryorefrigerator C21. The fluid preferably passes through the various elements in the above order.

The fourth feed branch 282 includes a pipe 2823 of the third exchanger E23, a pipe 2825 of the stage C211 of the cryorefrigerator C21, a pipe 2827 of the second exchanger E22 and a pipe 2829 of the stage C212 of the cryorefrigerator C21. The fourth feed branch 282 obviously also includes pipes 2822, 2824, 2826, 2828 and 2830 complementing the pipes 2823, 2825, 2827 and 2829 so as to guide some of the coolant fluid from the compressor 210 to the NMR device 220. A second portion of the coolant fluid therefore circulates from the compressor 210 to the NMR device 220 via the third exchanger E23, the stage C211 of the cryorefrigerator C21, the second exchanger E22 and the stage C212 of the cryorefrigerator C21. The fluid preferably passes through the various elements in the above order.

The first fluid portion flowing in the feed circuit consists of:
- a first flow that has the function of rotating the sample-holder 221 by acting on blades or fins of the turbine 2211 driving the rotor of the NMR device 220, the rotor including the sample-holder 221;
- a third flow that creates an aerostatic bearing supporting the rotor in a stator 222 of the NMR device 220; and, where applicable,
- a fourth flow for cooling the heat shield 240 protecting the NMR device 220 from thermal radiation.

The third circulation branch 281 therefore comprises three sub-branches:
- a first sub-branch for circulation of the first flow the function of which is to rotate the sample-holder 221 by acting on the blades or the fins of a drive turbine of the rotor of the NMR device 220, the rotor including the sample-holder 221;
- a second sub-branch for circulation of the third flow the function of which is to create a bearing supporting the rotor in a stator 222 of the NMR device 220;
- a third sub-branch for circulation of the fourth flow the function of which is to cool a heat shield 240 protecting the NMR device 220 from thermal radiation.

The first exchanger E21 and the cryorefrigerator C21, notably the stage C211 of this cryorefrigerator C21, therefore have at the level of the third branch 281 as many pipes as sub-branches.

The second fluid portion flowing in the feed circuit consists of a second flow that has the function of bringing the sample to an appropriate temperature. Thus, the fourth branch 282 which conducts the second fluid portion also conducts the single flow of this second fluid portion whose sole function is to bring the sample to an appropriate temperature.

The second branch 262 includes a flow rate regulator 2628.

The third branch 281 includes three flow rate regulators 2811. They make it possible to adjust and/or to regulate the flow rates in the three sub-branches.

The fourth branch 282 includes a flow rate regulator 2821.

These regulators 2628, 2811, 2821 are preferably of the flowmeter-regulator type, i.e. they also make it possible to measure the flow rates.

The channeling system 250 also includes a control module 205 like a microcontroller for receiving flow rate information and calculating as a consequence thereof control instructions that are transmitted to the regulators 2628, 2811, 2821. Those instructions determine configurations of the various regulators 2628, 2811, 2821.

In the first and second embodiments the references of elements that are identical or have the same function differ only by their first digit: a "1" for elements of the first embodiment and a "2" for elements of the second embodiment.

In the various embodiments, the various exchangers E11 to E13 and E21 to E23 differently called heat exchangers or thermal exchangers, are preferably contraflow exchangers.

In the various embodiments, the fluid used is helium, for example. This fluid can be in a liquid or gaseous state and can be notably maintained at a cryogenic temperature. The fluid can also undergo phase changes. Besides, the fluid can be in gaseous state in one part of the system and in liquid state in another part of the system.

In the various embodiments, the NMR device 120, 220 comprises the rotor or sample-holder 121; 221 and the stator 122; 222.

The invention also relates to a method of operating a system 100; 200; 150; 250 described above.

According to a first aspect of the method, the first and second branches conduct simultaneously the coolant fluid, notably between a NMR device 120, 220 of the NMR system 100; 200 and a compressor 110, 210 of the NMR system 100; 200.

Preferably, the flow rates in the various branches are regulated.

The regulation of the flow rates is advantageously such that the fluid flow rates in the first and third branches 161, 261, 181, 281 are equal or subsequently equal.

The regulation of the flow rates is advantageously such that the flow rates in the second and fourth branches 162, 262, 182, 282 are equal or substantially equal. In particular, the regulators 1628 and 1821 or 2628 and 2821 are slaved to conform to this equality.

The flow rates referred to above are mass flow rates.

According to a second aspect of the method, the flow rates are regulated so that the fluid flow rates in the first and third branches are equal or substantially equal and/or in that the fluid flow rates are regulated so that the flow rates in the second and fourth branches are equal or substantially equal.

Various numbers appear in FIGS. 1 and 2 in addition to the reference signs. These are examples of fluid temperature at the various points of the channeling system 150, 250 where the numbers are located, i.e. at the inlet and outlet of the exchangers E11 to E13 and E21 to E23, the cryorefrigerators C11 to C14 and C21 and the NMR device 120, 220. These temperatures are expressed in Kelvins.

According to the invention, separating the flow that has the function of bringing the sample to an appropriate temperature from the other flows that have the function of rotating the sample-holder 121, 221, creating an aerostatic bearing supporting the rotor in a stator 122, 222 of the NMR device 120, 220 or cooling the heat shield 140, 240 protecting the NMR device 120, 220 from thermal radiation offer a high level of flexibility in the operation of the NMR system 100, 200.

The invention claimed is:

1. Fluid channelling system for NMR system, wherein the fluid channelling system includes:
   an exhaust circuit of the NMR system configured to conduct a coolant fluid from a NMR device to a compressor of the NMR system, the exhaust circuit comprising:
   a first branch which is a first fluid circulation branch, and
   a second branch which is a second fluid circulation branch, a feed circuit of the NMR system configured to conduct the coolant fluid from the compressor to the NMR device, the feed circuit comprising:
a third branch which is a third fluid circulation branch, and
a fourth branch which is a fourth fluid circulation branch, and
a first heat exchanger comprising at least one stage, wherein the first branch includes a pipe of the stage of the first heat exchanger and the third branch includes a pipe of the stage of the first heat exchanger, whereas the second and fourth branches do not include a pipe of the stage of the first heat exchanger, so that the fluid channelling system is configured to exchange heat between a fluid in the first branch and a fluid in the third branch in the stage of the first heat exchanger.

2. The fluid channelling system according to claim 1, wherein the fluid channelling system comprises a first cryorefrigerator comprising at least one stage, wherein the second branch includes a pipe of the stage of the first cryorefrigerator upstream of the stage of the heat exchanger, so that the fluid channelling system is configured to cool the fluid in the fourth branch at a lower temperature than a fluid in the third branch.

3. The fluid channelling system according to claim 1, wherein the fluid channelling system comprises at least one selected from the group consisting of a second heat exchanger and a second stage of the first heat exchanger, wherein the second branch includes a pipe of the second exchanger or second stage of the heat exchanger and the fourth branch includes a pipe of the second exchanger or second stage of the first heat exchanger, so that the fluid channelling system is configured to exchange heat between the fluid in the second branch and the fluid in the fourth branch in the second heat exchanger or second stage of the first heat exchanger.

4. The fluid channelling system according to claim 1, wherein the third fluid circulation branch includes a plurality of sub-branches.

5. The fluid channelling system according to claim 2, wherein the fluid channelling system comprises a second cryorefrigerator comprising at least one stage, a third cryorefrigerator comprising at least one stage, and a fourth cryorefrigerator comprising at least one stage, whereinthe third branch includes at least one pipe of the stage of the second cryorefrigerator, and the fourth branch includes a pipe of the stage of the third cryorefrigerator and a pipe of the stage of the fourth cryorefrigerator.

6. The fluid channelling system according to claim 5, wherein the second cryorefrigerator and the third cryorefrigerator are the same cryorefrigerator.

7. The fluid channelling system according to claim 5, wherein the first cryorefrigerator and the fourth cryorefrigerator are the same cryorefrigerator.

8. The fluid channelling system according to claim 5, wherein the fluid channelling system includes a single cryorefrigerator.

9. The fluid channelling system according to claim 3, wherein the fluid channelling system comprises at least one selected from the group consisting of a third heat exchanger and a third stage of the heat exchanger, wherein the second branch includes at least one pipe of the third heat exchanger or third stage of the heat exchanger, and wherein the fourth branch includes at least one pipe of the third exchanger or third stage of the heat exchanger.

10. The fluid channelling system according to claim 1, wherein the second branch includes a flow rate regulator.

11. The fluid channelling system according to claim 1, wherein at least one selected from the group consisting of (i) the third branch includes at least one flow rate regulator, and (ii) the fourth branch includes a flow rate regulator.

12. NMR system including the fluid channelling system according to claim 1 and an NMR device.

13. Method of operating the fluid channelling system according to claim 1, comprising conducting a coolant fluid simultaneously in the first and second branches.

14. Method of operating the fluid channelling system according to claim 1, comprising at least one regulating action selected from the group consisting of:
(i) regulating fluid flow rates so that the fluid flow rates in the first and third branches are equal or substantially equal, and
(ii) regulating fluid flow rates so that the fluid flow rates in the second and fourth branches are equal or substantially equal.

15. The fluid channelling system according to claim 4, wherein the plurality of sub-branches of the third branch includes at least one selected from the group consisting of (i) a first sub-branch configured for circulation of a first flow the function of which is to rotate a sample-holder by acting on blades or fins of a drive turbine of a rotor of a NMR device, the rotor including the sample-holder, (ii) a second sub-branch configured for circulation of a third flow the function of which is to create a bearing supporting the rotor in a stator of a NMR device, and (iii) a third sub-branch configured for circulation of a fourth flow the function of which is to cool a heat shield protecting a NMR device from thermal radiation.

16. The fluid channelling system according to claim 6, wherein the stage of the second cryorefrigerator and the stage of the third cryorefrigerator are the same stage of the same cryorefrigerator.

17. The fluid channelling system according to claim 7, wherein the stage of the first cryorefrigerator and the stage of the fourth cryorefrigerator are the same stage of the same cryorefrigerator.

18. The fluid channelling system according to claim 8, wherein the single cryorefrigerator includes a first stage and a second stage, wherein the second and third cryorefrigerators are the first stage and the first and fourth cryorefrigerators are the second stage.

19. Method of operating the NMR system according to claim 12, wherein the first and second branches conduct simultaneously the coolant fluid between a NMR device of the NMR system and a compressor of the NMR system.

20. Fluid channelling system for NMR system, wherein the channelling system includes:
an exhaust circuit of the NMR system configured to conduct a coolant fluid from a NMR device to a compressor of the NMR system, the exhaust circuit comprising:
a first branch which is a first fluid circulation branch, and
a second branch which is a second fluid circulation branch,
a feed circuit of the NMR system configured to conduct the coolant fluid from the compressor to the NMR device, the feed circuit comprising:
a third branch which is a third fluid circulation branch, and
a fourth branch which is a fourth fluid circulation branch, and
wherein the fourth branch comprises a pipe of a cryorefrigerator, whereas the third branch does not comprise a pipe of the cryorefrigerator.

21. The fluid channeling system according to claim 1, comprising a second heat exchanger comprising at least one stage, wherein the second branch includes a pipe of the stage of the second heat exchanger and the fourth branch includes a pipe of the stage of the second heat exchanger, so that the fluid channelling system is configured to exchange heat between a fluid in the second branch and a fluid in the fourth branch in the stage of the second heat exchanger.

22. The fluid channeling system according to claim 21, wherein the first and third branches do not include a pipe of the stage of the second heat exchanger.

\* \* \* \* \*